(12) United States Patent
Lindsey et al.

(10) Patent No.: US 7,667,611 B2
(45) Date of Patent: Feb. 23, 2010

(54) HIGH VOLTAGE DETECTION SYSTEM

(75) Inventors: Robert Wayne Lindsey, Washington, IL (US); Eric Matthew Andris, Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 388 days.

(21) Appl. No.: 11/289,291

(22) Filed: Nov. 30, 2005

(65) Prior Publication Data

US 2007/0120694 A1 May 31, 2007

(51) Int. Cl.
G08B 21/00 (2006.01)
(52) U.S. Cl. .................. 340/662; 318/254.1; 318/798
(58) Field of Classification Search ......... 340/635–664; 318/254, 798, 439, 800
See application file for complete search history.

(56) References Cited

U.S. PATENT DOCUMENTS

| 3,576,486 | A | * | 4/1971 | Graziano et al. ............. 318/573 |
| 3,576,487 | A | * | 4/1971 | Chase ........................ 320/139 |
| 4,285,023 | A | * | 8/1981 | Kalivas ...................... 361/91.1 |
| 4,739,245 | A | | 4/1988 | Komurasaki et al. |
| 4,943,777 | A | | 7/1990 | Nakamura et al. |
| 5,781,013 | A | | 7/1998 | Takahashi |
| 5,869,951 | A | * | 2/1999 | Takahashi .................... 320/104 |
| 6,091,337 | A | * | 7/2000 | Arshad et al. ................ 340/662 |
| 6,392,316 | B1 | * | 5/2002 | Yoshioka et al. .............. 307/66 |
| 6,480,114 | B2 | * | 11/2002 | Estelle ........................ 340/662 |
| 6,606,227 | B2 | | 8/2003 | Rapsinski et al. |
| 6,885,215 | B1 | | 4/2005 | Hou et al. |
| 6,906,525 | B2 | | 6/2005 | Suzuki |
| 7,098,624 | B2 | * | 8/2006 | Kusaka ....................... 318/727 |
| 7,265,505 | B2 | * | 9/2007 | Nakai et al. ............. 318/400.09 |
| 7,268,505 | B2 | * | 9/2007 | Pant et al. .............. 318/400.01 |

* cited by examiner

*Primary Examiner*—Davetta W Goins
*Assistant Examiner*—Edny Labbees
(74) *Attorney, Agent, or Firm*—Finnegan, Henderson, Farabow, Garrett & Dunner

(57) ABSTRACT

Systems and methods are disclosed for detecting high-voltage levels associated with a work machine. In one embodiment a high-voltage detection system is disclosed and includes a threshold detector configured to determine a voltage level associated with an element, determine whether the voltage level associated with the element is greater than a predetermined threshold value, and provide a threshold indicator if the voltage level associated with the element is greater than the predetermined threshold value. The system also includes a controller coupled to the threshold detector via an isolation device. The controller is configured to detect the threshold indicator and provide one or more warning signals in response to the threshold indicator.

20 Claims, 3 Drawing Sheets

HIGH VOLTAGE DETECTION SYSTEM

TECHNICAL FIELD

This application relates to a voltage detection system and, more particularly, to a high-voltage detection system and method for a work machine.

BACKGROUND

High-voltage electric motors are becoming increasingly popular in industrial applications due to their higher efficiency and lower maintenance requirements than their mechanical counterparts. Traditionally, high-voltage motors contain large charge-storing devices that stabilize energizing power to the motor. During normal operation these charge storing devices may be capable of storing several thousand volts of potential energy. Even when the motor is powered down, the charge-storing devices may store high-voltage charges for substantial amounts of time. These charge-storing devices could, if not allowed adequate time to discharge, present a safety hazard to maintenance personnel and/or equipment operators that come in close contact with the motor. Thus, it may be desirable to detect a high-voltage condition associated with an electric motor and provide a warning signal indicative of the high-voltage condition.

One system for detecting the voltage level of a power source is described in U.S. Pat. No. 6,885,215 to Hou et al. ("the '215 patent"). The '215 patent describes a voltage detector circuit with a programmable threshold point. The detector includes a voltage following circuit connected to a power source for tracking the voltage value of the power source and a selectable threshold point circuit connected to the voltage following circuit to provide the threshold value. The voltage detector described in the '215 patent is configured to generate an output indicative of whether the value of the power source has increased above or decreased below the threshold value. In one instance, the threshold point is established by the amount of current provided by the threshold point circuit, which may further be determined by the size and type of transistor used in the selectable threshold point circuit.

Although the voltage detection circuit described in the '215 patent may be effective for detecting voltage levels corresponding to certain programmable threshold values, it may include several disadvantages. For example, the system described in the '215 patent may provide insufficient isolation between the detection circuitry and the processor circuitry. As a result, transient signals, such as voltage or current spikes, may damage the processor circuitry and/or other systems that are in contact with detection circuitry.

In addition, the voltage detection circuit described in the '215 patent may lack reliability. For example, because the detection circuit of the '215 patent operates exclusively from a primary power source, it may be incapable of operation in the event of a power failure. As a result, equipment systems that rely on continuous voltage detection even in the event of loss of power may become inoperable.

The disclosed high-voltage detection system is directed towards overcoming one or more of the problems set forth above.

SUMMARY OF THE INVENTION

Systems and methods are disclosed for detecting high-voltage levels associated with a work machine. In one embodiment a high-voltage detection system is disclosed and may include a threshold detector configured to determine a voltage level associated with an element, determine whether the voltage level associated with the element is greater than a predetermined threshold value, and provide a threshold indicator if the voltage level associated with the element is greater than the predetermined threshold value. The system may also include a controller coupled to the threshold detector via an isolation device. The controller may be configured to detect the threshold indicator and provide one or more warning signals in response to the threshold indicator.

In another embodiment, a high-voltage detection method is disclosed. The method may include receiving a signal indicative of a voltage level of an element. The method may also include sampling the signal indicative of the voltage level of the element to determine whether the voltage level of the element is above a predetermined threshold value. The method may further include providing a threshold indicator if the signal is greater than a predetermined threshold value. The method may also include receiving the threshold indicator via an isolation device and generating one or more warning signals in response to the threshold indicator.

According to yet another embodiment, the present disclosure is directed toward a work machine. The work machine may include a power source for providing a power output, an electric motor coupled to the power source, and a high-voltage detection system operatively coupled to the electric motor. The high-voltage detection system may include a threshold detector configured to determine a voltage level associated with an element, determine whether the voltage level associated with the element is greater than a predetermined threshold value, and provide a threshold indicator if the voltage level associated with the element is greater than the predetermined threshold value. The high-voltage detection system may also include a controller coupled to the threshold detector via an isolation device. The controller may be configured to detect the threshold indicator from the threshold detector and provide one or more warning signals in response to the threshold indicator. The isolation device may minimize a flow of current between the controller and the threshold detector.

DETAILED DESCRIPTION

Figure 1:
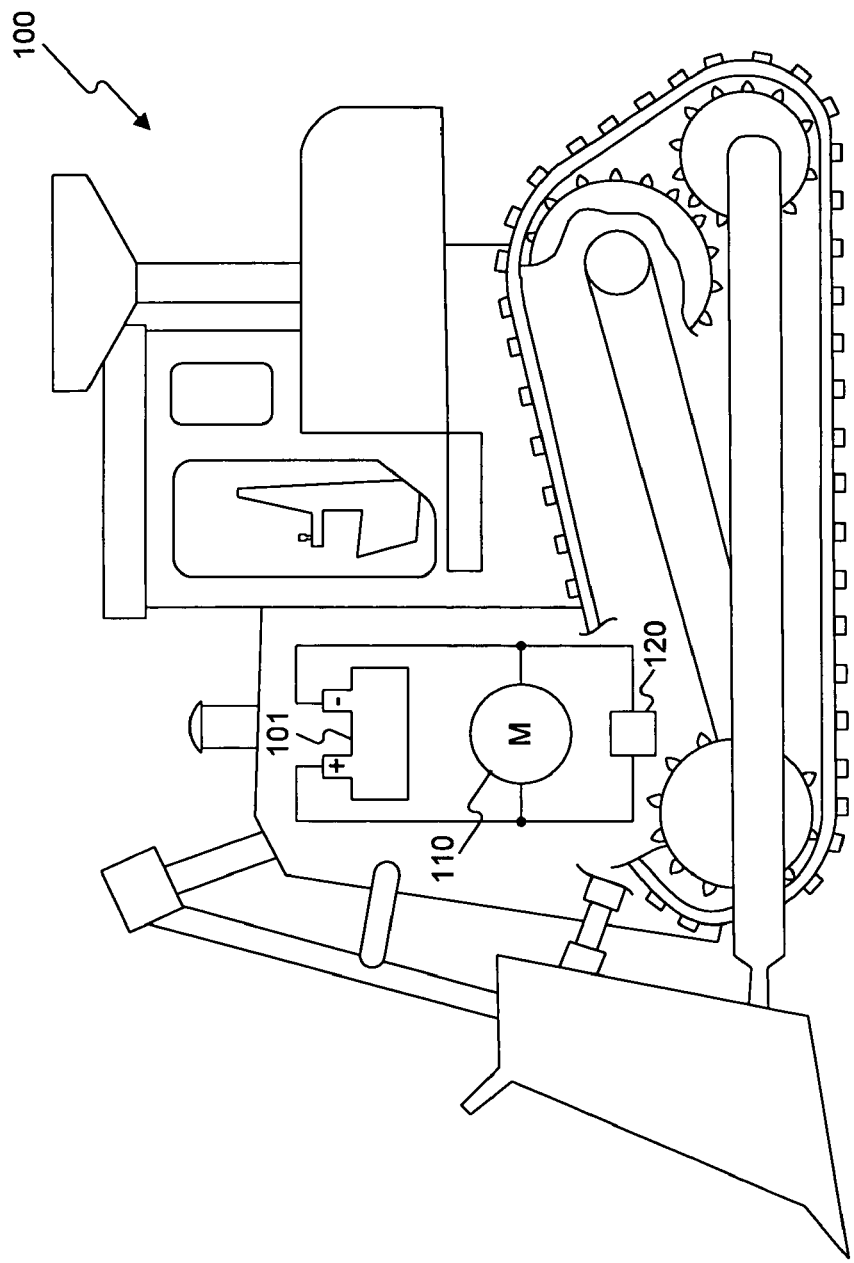
FIG. 1 illustrates a work machine consistent with an exemplary disclosed embodiment.

FIG. 1 illustrates an exemplary disclosed work machine 100 consistent with certain disclosed embodiments. Work machine 100 may include, among other things a power source 101, one or more electric motors 110, and a high voltage detection system 120. Work machine, as the term is used herein, refers to a fixed or mobile machine that may perform some type of operation associated with a particular industry, such as mining, construction, farming, etc. and operate between or within work environments (e.g., a construction site, mine site, power plant, etc.) A non-limiting example of a fixed machine includes an engine system operating in a plant or off-shore environment (e.g., off-shore drilling platform). Non-limiting examples of mobile machines include commercial machines, such as trucks, cranes, earth moving vehicle, mining vehicles, backhoes, material handling equipment, farming equipment, marine vessels, aircraft, on-highway vehicles, or any other type of movable machine that operates in a work environment.

Power source 101 may include various components configured to provide electric power for use by one or more components of work machine 100. For instance, power source 101 may include a generator driven by an engine, such as a combustion engine. Alternatively, power source 101 may include any other suitable device for providing a power output such as, for example, a battery, a fuel cell, or any other type of power source configured to provide electrical power to work machine 100.

Electric motor 110 may be coupled to power source 101 and may be configured to convert at least a portion of the electric power output to mechanical energy for performing a task associated with work machine 100. For example, electric motor 110 may include an AC induction motor, a brushless DC motor, a variable or switched reluctance motor, a stepper motor, a linear motor, or any other type of motor.

High voltage detection system 120 may be coupled to electric motor 110 and configured to detect a voltage level associated with electric motor 110 and provide an output indicative of the voltage level. For example, high voltage detection system 120 may be electrically connected to one or more energizing terminals of electric motor 110 to measure the voltage potential associated with the terminals. Alternatively and/or additionally, voltage detection system 120 may be coupled to one or more components associated with electric motor 110 to detect a specific voltage level associated with the respective component.

Figure 2:
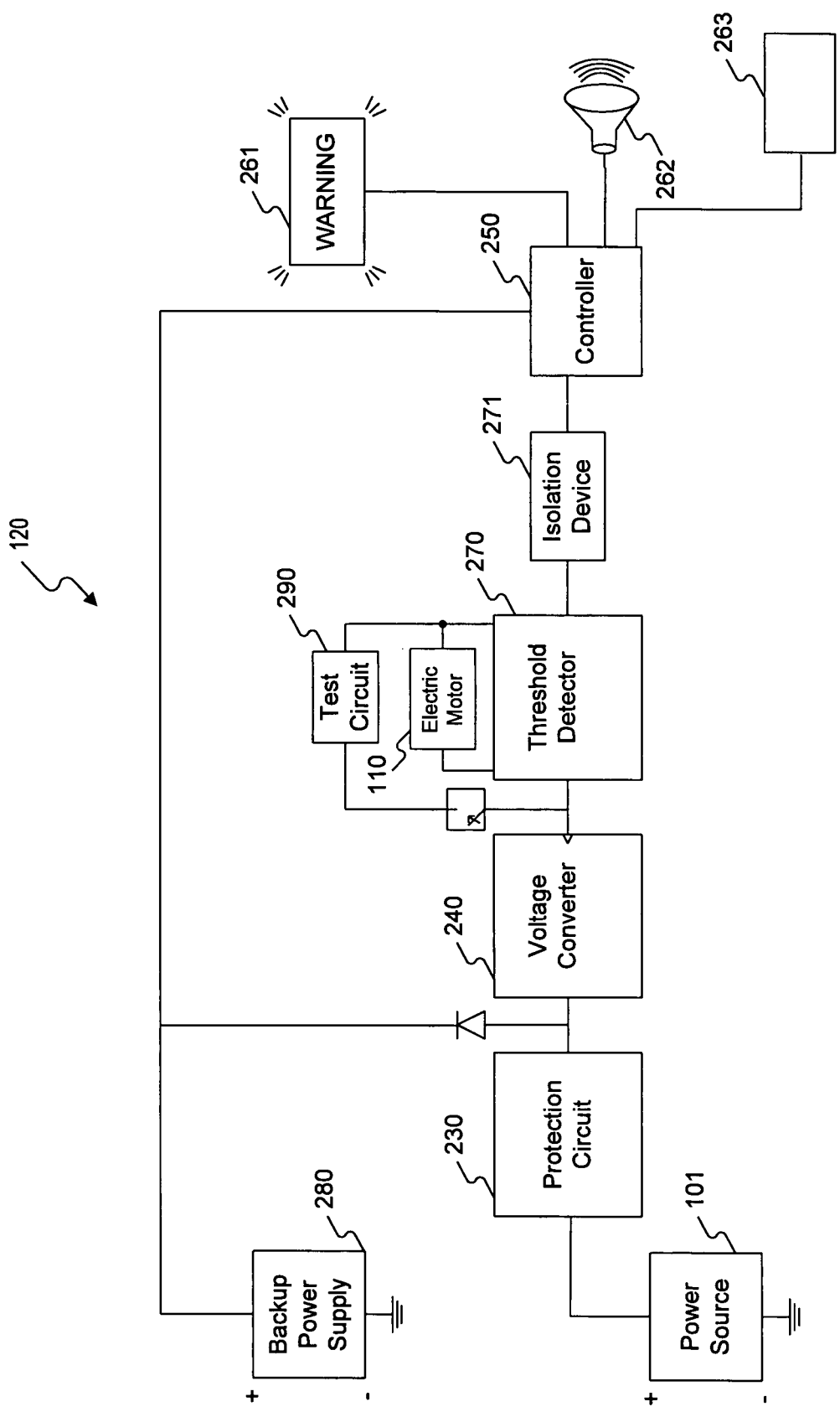
FIG. 2 provides a block diagram of a high voltage detection system consistent with an exemplary disclosed embodiment.

As illustrated in the block diagram of FIG. 2, high voltage detection system 120 may include, among other things, a protection circuit 230, a voltage converter 240, a controller 250, one or more output devices 261-262, a threshold detector 270, a backup power supply 280, and a test circuit 290. High voltage detection system 120 may be included as an integral part of electric motor 110, such as part of a power control system for work machine 100. Alternatively, high voltage detection system 120 may be external to electric motor 110, such as, for example, as part of a separate electronic control module (ECM) associated with work machine 100.

Protection circuit 230 may be electrically coupled to power source 101 and configured to regulate the energy supplied to one or more components associated with high voltage detection system 120. For example, protection circuit 230 may include one or more diodes, capacitors, fuses, transistors, surge protection devices, and/or inductors arranged to provide energy from power source 101 to high voltage detection circuit 120, while minimizing and/or preventing the flow of current from high voltage detection circuit 120 into power source 101. Thus, it is contemplated that protection circuit 230 may include any protection device or other combination of elements that allows unidirectional flow of energy between elements. Furthermore, according to one embodiment, protection circuit 230 may include low-loss components such that substantially all of the energy available at an input (i.e., supplied by power source 101) of the protection circuit 230 may be available at an output of protection circuit 230.

Backup power supply 280 may be electrically coupled to protection circuit 230 and may include one or more components configured to provide backup power. For example, backup power supply 280 may include one or more capacitors or capacitor banks that, when charged, may be operable to provide power to high-voltage detection system 120. Alternatively and/or additionally, backup power supply may include any source of electric energy, such as a battery, a generator, a fuel cell, or any other device operable to provide an electric power output. Backup power supply 280 may be configured in series or parallel with power source 101. In one exemplary embodiment, backup power supply 280 may be configured in parallel with power source 101 to provide a redundant power source for high voltage detection system 120 in the event of a loss of system power.

Voltage converter 240 may be coupled to protection circuit 230 and configured to transform the voltage level associated with protection circuit 230 to a predetermined level. For instance, voltage converter 240 may be coupled to an output of protection circuit 230 and may be configured to convert the voltage level at the output of protection circuit 230 to a different voltage for use by one or more components associated with high voltage detection system 240. Voltage converter 240 may include an upconverter (i.e., a device to transfer a voltage level to a higher voltage level) and/or a downconverter (i.e., a device to transfer a voltage level to a lower voltage level). Voltage-converter 240 may include an isolation component to provide isolated power to the threshold detector (270). Moreover, voltage converter 240 may include a programmable interface that allows a user to specify a desired voltage level or conversion ratio. Voltage converter 240 may include any type of voltage converter such as, for example, a DC/DC voltage converter, an AC/DC converter, a DC/AC converter, a pulse converter, or any other type of voltage converter.

Controller 250 may include one or more components configured to receive, store, and/or transmit a signal indicative of a high voltage condition associated with electric motor 110. In one embodiment, controller 250 may include an input/output device (not shown) and/or a storage device (not shown) etc. configured to receive a signal indicative of a high voltage condition of electric motor 110, provide an output signal indicative of a high voltage condition associated with electric motor 110, and/or store data indicative of a high voltage condition in a storage device. Furthermore, controller 250 may include one or more sensor devices that each may detect a signal indicative of a high voltage condition associated with electric motor 110.

One or more output devices 261-262 may be operatively coupled to controller 250 and configured to provide a warning signal indicative of a high voltage condition associated with electric motor 110 to a user of work machine 100. For instance, one or more output devices 261-262 may include any component configured to provide a warning signal to a user associated with work machine such as, for instance, a visual device 261 (e.g., warning lamp, LCD display, LED light, etc.); an audible device 262 (e.g., speaker, bell, chime, etc.); a wireless device (not shown) (e.g., cell phone, pager, etc.); or any other type of output device. In one embodiment, an LCD display may be coupled with an audible alarm to provide a combination audio/visual warning system. It is also contemplated that additional, fewer, and/or different output devices than those listed above may be associated with high voltage detection system 120.

In one embodiment, an actuator 263 may be operatively coupled to the controller 250 and configured to produce a mechanical output in response to a high voltage condition associated with electric motor 110. Actuator 263 may include any device that is configurable to prevent access to an element in the presence of a high-voltage condition. For example, actuator 263 may include a locking mechanism adapted to lock high voltage component associated with work machine 100 in response to a high-voltage condition. Once the high voltage condition has subsided, actuator 263 may release the locking mechanism, allowing a user to access the motor housing.

Threshold detector 270 maybe coupled to an electric motor 110 and configured to monitor a voltage level associated with the electric motor 110. For instance, threshold detector 270 may be coupled to electric motor 110 to measure and detect a high-voltage condition associated with electric motor 110. Alternatively and/or additionally, threshold detector 270 may be electrically coupled to one or more components or subsystems of electric motor 110 such as, for example, stator windings, start-up capacitors, voltage regulators, charge-stabilizing capacitors, charge-storing devices, or any other device associated with electric motor 110. In one embodiment, threshold detector 270 may be electrically coupled to one or more high-voltage capacitors (not shown) associated with electric motor 110. Accordingly, threshold detector 270 may monitor a voltage level stored in the capacitor.

Threshold detector 270 may be coupled to controller 250 and configured to provide a threshold indicator to controller 250 in response to a high-voltage condition associated with electric motor 110. For example, threshold detector 270 may provide the threshold indicator to controller 250 corresponding to a high-voltage condition monitored from one or more components associated with electric motor 110. Moreover, threshold detector 270 may be configured to vary the intensity of the threshold indicator based on an amount that the signal indicative of the voltage level exceeds a predetermined threshold value. For purposes of this disclosure, the threshold indicator may include any type of signal for indicating the presence of a high voltage condition associated with electric motor 110 such as, an analog or digital signal, an optical signal, an audio signal, or any other type of signal suitable for indicating a high voltage condition.

According to one embodiment, threshold detector 270 may be coupled to controller 250 using one or more isolation devices 271 to prevent the flow of current between threshold detector 270 and/or controller 250. For example, threshold detector 270 may be coupled to controller 250 via one or more optical isolators. Optical isolators may provide a mechanism for data transfer using an optical signal, while limiting the flow of current that could potentially interfere and/or damage electrical systems. Isolating devices 271 may include one or more components that provide current isolation between threshold detector 270 and controller 250 such as, for example, an optical isolator, a magnetic isolation device, a transformer device, a wireless communication link (e.g., infrared, microwave, Bluetooth, etc.), a wireless (such as LED, microwave, or infrared) transmitter/detector pair, or any other suitable current isolating device.

Figure 3:
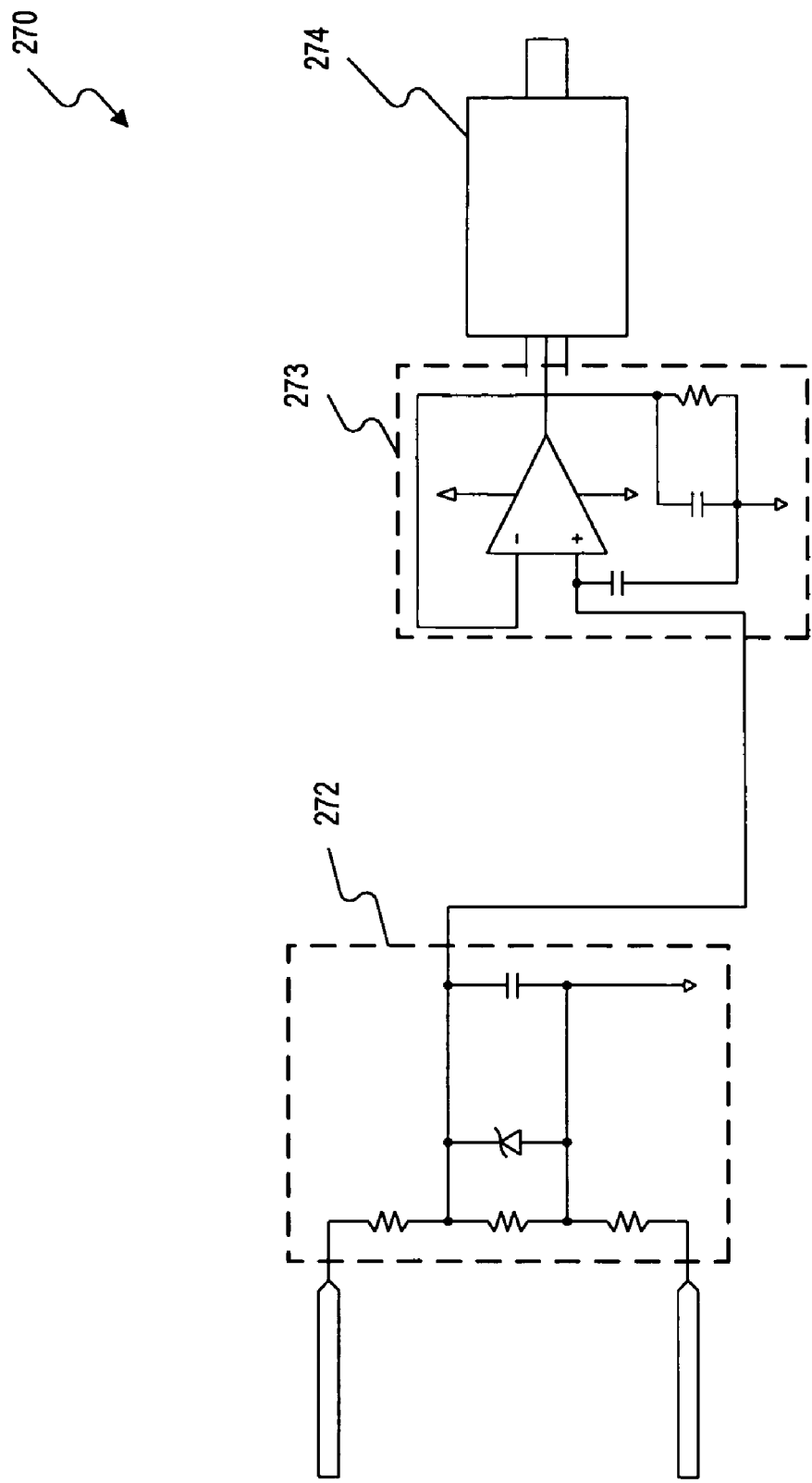
FIG. 3 provides a schematic illustration of an exemplary disclosed threshold detector associated with the high-voltage detection system shown in FIG. 2.

In accordance with an exemplary embodiment, threshold detector 270 may include one or more separate components that cooperate to monitor a voltage level associated with electric motor 110, compare the voltage level to a predetermined threshold value, and provide, if the voltage level is greater than the predetermined threshold value, a threshold indicator to controller 250 until the voltage level drops below the predetermined threshold value. For instance, as illustrated in FIG. 3, threshold detector may include a voltage transformer 272, a buffer circuit 273, and a threshold controller 274. It is contemplated that threshold detector 270 may include additional, fewer, and/or different components than those listed. Moreover, certain embodiments may substitute alternate circuit arrangements to realize substantially similar function for one or more components of high voltage detection system 120. Furthermore, although threshold detector 270 is described as being configured to compare a the voltage level associated with the electric motor to a predetermined threshold value, it is contemplated that threshold detector 270 may compare any high-voltage condition associated with electric motor 110 indicative of a high-voltage condition with a predetermined threshold condition. For purposes of this disclosure, high-voltage conditions may include any condition indicative of an elevated voltage level such as, for example, a single voltage level, a voltage range, a temperature of a motor winding, an overcurrent condition associated with the motor, etc. Similarly, the predetermined threshold condition may include any condition that establishes a benchmark, limit, and/or range associated with one or more high-voltage conditions including, for example, a voltage value, a power range, a temperature range, a current limit, or any other suitable benchmark.

Voltage transformer 272 may be configured to transform the voltage potential associated with electric motor 110 to an alternate voltage level appropriate for circuit operation in a respective voltage detection circuit. For example, as shown in FIG. 3, voltage transformer 272 may include a voltage divider circuit with current and other voltage regulating devices such as zener diodes, etc., to reduce the input voltage provided to other components of high voltage detection system 120. Although FIG. 3 illustrates voltage transformer 272 as a voltage divider, it is contemplated with any suitable voltage conversion device may be used, such as a voltage regulator, a voltage buffer, a voltage limiter, or any suitable type of voltage transformer.

Buffer circuit 273 may include one or more devices to track a voltage level while substantially limiting current flow through the device. For example, as shown in FIG. 3, buffer circuit 273 may include a voltage follower that provides current isolation between the inputs and the output, while the output tracks the voltage level at the input. Thus, a voltage level provided to an input terminal of the voltage follower is realized at the output terminal, while limiting the current flow through the voltage follower. Although buffer circuit 273 is illustrated in FIG. 3 as a voltage follower, it is contemplated that any voltage buffer device may be implemented, such as, a transistor, mosfet, integrated circuit, etc.

Threshold controller 274 may include one or more components (not shown) configured to compare the voltage level to a predetermined threshold value, provide filtering and hysteresis, and generate a threshold indicator if the voltage level is greater than the predetermined threshold value. For instance, threshold controller 274 may detect the voltage level provided by voltage follower 273 and determine if the voltage level is greater than a predetermined threshold value stored in threshold controller. If the voltage level is greater than the predetermined threshold value, a threshold indicator may be provided to controller 250 via isolation device 271.

Test circuit 290 may be selectively coupled to threshold detector 270. For example, test circuit 290 may be coupled to threshold detector 270 via a switch that allows a user to activate test circuit 290. Alternatively and/or additionally, test circuit 290 may be coupled to threshold detector 270 using any appropriate selective coupling device, such as a relay, a test probe, a circuit breaker, or any type of selective coupling device.

Test circuit 290 may be configured to allow a user to test the operability of high voltage detection system by providing, to threshold detector 270, a test signal that simulates the presence of a high voltage condition on electric motor 110. Threshold detector 270 may detect the test signal and provide a threshold indicator to controller 250 in response to the simulated high voltage condition. As a result, one or more output devices 261-262 may operate indicating that high voltage detection system is operating appropriately. Alternatively and/or additionally, if the test signal corresponding to a simulated high voltage signal does not cause operation of the one or more output devices 261-262, test circuit 290 may provide an indication that high voltage detection system 120 may not be operating appropriately.

High-voltage detection system 120 may be configured to determine a voltage level and provide an output signal associated with the determined voltage level. According to one embodiment, high-voltage detection system 120 may be configured to detect a voltage level associated with one or more components of electric motor 110, such as a high voltage capacitor or other charge-storing device. High-voltage detection system 120 may determine if a high-voltage condition exists (e.g., the voltage level is greater than a predetermined threshold value) and provide an audible and/or visual warning signal indicative of the high-voltage condition.

High voltage detection system 120 may continuously and/or periodically monitor the voltage level of electric motor 110 or its associated components. Accordingly, high voltage detection system 120 may provide one or more continuous warning signals until the high-voltage condition has subsided (e.g., the voltage level drops below a predetermined threshold value).

In another embodiment, high-voltage detection system 120 may be equipped with a redundant source of power configured to provide continuous power in the event of a loss of power supplied by power source 101. For example, if main work machine power is lost due to an electric system failure, backup power source 280 may be configured to provide the power necessary to maintain operation of high-voltage detection system 120. High-voltage detection system 120 may be configured to detect when the system is operating on backup power supplied by backup power supply 280 and provide a high-voltage warning signal for a predetermined period sufficient to allow the voltage associated with electric motor 110 to dissipate below the predetermined threshold value. Once the voltage associated with electric motor 110 drops below a predetermined threshold value, the warning signal may be disabled. Thus, high-voltage detection system 120 may be configured to operate in the event of a loss of main power to work machine 100.

According to one embodiment, a user of high-voltage detection system 120 may modify the predetermined threshold value and/or the sensitivity of high-voltage detection system 120. For example, one or more circuit elements of high-voltage detection system 120 may be modified or replaced to adjust the sensitivity of the detection system (e.g., from a sensitivity of +/−1 volt to a sensitivity of +/−0.1 volts). Alternatively and/or additionally, a user may modify the predetermined threshold value associated with high voltage detection system. Thus, high-voltage detection system 120 may be scaled to operate in systems with various voltage levels and sensitivity requirements.

INDUSTRIAL APPLICABILITY

Methods and systems consistent with the disclosed embodiments are directed to a voltage detection system that may be configured to indicate if a detected voltage exceeds a predetermined threshold value. Work machines that employ processes and elements consistent with certain disclosed embodiments may be configured to monitor high-voltage levels and provide a warning signal indicative of a high voltage condition.

Although the disclosed embodiments are described in association with a high-voltage detection system for a work machine, the disclosed voltage detection system may be used in any environment where it may be desirable to monitor a voltage level and provide an output indicative of the monitored voltage. Specifically, the disclosed voltage detection system may detect a voltage level associated with an electric device, compare the detected voltage to a predetermined threshold value, and provide an output signal indicative of a deviation of the detected voltage from the predetermined threshold value. Moreover, the disclosed voltage detection system may provide a diagnostic device for ensuring that the voltage detection system is operating appropriately.

According to one embodiment, high-voltage detection system 120 may include one or more isolation devices for minimizing and/or preventing the current flow between threshold detector 270 and the other components associated with high-voltage detection system 120. As a result, high-voltage detection system 120 may measure elements capable of storing extremely high voltages while isolating the remainder of the system from potential power surges from the high voltage elements. Thus, problems associated with system damage due to transient signals and power surges associated with conventional voltage monitoring devices may be significantly reduced and/or eliminated.

Furthermore, with the inclusion of the backup power supply, high-voltage detection system 120 may provide increased reliability over conventional voltage detectors. For example, should a work machine employing the disclosed high-voltage detection system 120 lose primary power, high-voltage detection system 120 may be configured to operate using backup power supply 280. Thus, in the event of a loss of primary power, high-voltage detection system 120 may ensure that the high-voltage warning devices operate while the high voltage signals dissipate.

It will be apparent to those skilled in the art that various modifications and variations can be made to the disclosed high-voltage detection system without departing from the scope of the invention. Other embodiments of the present disclosure will be apparent to those skilled in the art from consideration of the specification and practice of the present disclosure. It is intended that the specification and examples be considered as exemplary only, with a true scope of the present disclosure being indicated by the following claims and their equivalents.

What is claimed is:

1. A machine, comprising:
    a power source for providing a power output;
    an electric motor coupled to the power source;
    a high-voltage detection system operatively coupled to the electric motor, wherein the high-voltage detection system includes:
        a threshold detector, configured to:
            determine a voltage level associated with an element;
            determine whether the voltage level associated with the element is greater than a predetermined threshold value;
            provide a threshold indicator if the voltage level associated with the element is greater than the predetermined threshold value;
        a controller coupled to the threshold detector via an isolation device and configured to:
            detect the threshold indicator from the threshold detector, and
            provide one or more warning signals in response to the threshold indicator for a period of time sufficient to allow the voltage level associated with the element to dissipate below the predetermined threshold value; and a backup power supply for providing backup power to the high-voltage detection system,
wherein the controller is further configured to:
detect when the high-voltage detection system is operating on backup power;
determine a power level associated with the backup power supply; and
provide the one or more warning signals based on the determined power level.

2. The machine of claim 1, wherein the isolation device includes a current isolator for isolating a current flow between at least a portion of the threshold detector and at least a portion of the controller.

3. The machine of claim 1, wherein the element includes an electric motor.

4. The machine of claim 1, wherein the element includes one or more charge storing devices associated with an electric motor.

5. The machine of claim 1, wherein the isolation device includes one of an optical device, a magnetic device, and a wireless device.

6. The machine of claim 1, wherein the isolation device includes at least one transmitter/detector pair.

7. The machine of claim 1, further including a test circuit selectively coupled to the threshold detector and configured to provide a test signal corresponding to a voltage level that is greater than the predetermined threshold value.

8. The machine of claim 1, wherein the threshold detector includes an interface configured to allow a user to modify one or more threshold conditions.

9. The machine of claim 1, further including an actuator operatively coupled to the controller and configured to operate in response to the threshold indicator.

10. The machine of claim 9, wherein the actuator includes a locking mechanism adapted to lock a compartment associated with the element.

11. A high-voltage detection system, comprising:
a threshold detector configured to:
determine a voltage level associated with an element,
determine whether the voltage level associated with the element is greater than a threshold value associated with the element, and
provide a threshold indicator if the voltage level associated with the element is greater than the threshold value;
a backup power supply for providing backup power to the high-voltage detection system; and
a controller coupled to the threshold detector via an isolation device and configured to:
detect the threshold indicator,
provide one or more warning signals in response to the threshold indicator for a period of time sufficient to allow the voltage level associated with the element to dissipate below the threshold value associated with the element,
detect when the high-voltage detection system is operating on backup power provided by the backup power supply,
determine a power level associated with the backup power supply, and
provide the one or more warning signals based on the determined power level associated with the backup power supply.

12. The detection system of claim 11, further including an actuator operatively coupled to the controller and configured to operate in response to the threshold indicator.

13. The detection system of claim 11, wherein the isolation device includes a current isolator for isolating a current flow between at least a portion of the threshold detector and at least a portion of the controller.

14. The detection system of claim 11, wherein the isolation device includes one of an optical device, a magnetic device, and a wireless device.

15. The detection system of claim 11, wherein the isolation device includes at least one transmitter/detector pair.

16. The detection system of claim 11, wherein the element includes an electric motor.

17. The detection system of claim 11, wherein the element includes one or more charge storing devices associated with an electric motor.

18. The detection system of claim 11, further including a test circuit selectively coupled to the threshold detector and configured to provide a test signal corresponding to a voltage level that is greater than the predetermined threshold value.

19. The detection system of claim 11, wherein the threshold detector includes an interface configured to allow a user to modify one or more threshold conditions.

20. The detection system of claim 11, further including an actuator operatively coupled to the controller and configured to operate in response to the threshold indicator, wherein the actuator includes a locking mechanism adapted to lock a compartment associated with the element.

* * * * *